United States Patent
Wada et al.

(10) Patent No.: US 8,482,126 B2
(45) Date of Patent: Jul. 9, 2013

(54) SEMICONDUCTOR DEVICE

(75) Inventors: Makoto Wada, Yokohama (JP); Yuichi Yamazaki, Tokyo (JP); Akihiro Kajita, Yokohama (JP); Atsuko Sakata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/224,929

(22) Filed: Sep. 2, 2011

(65) Prior Publication Data

US 2013/0056873 A1 Mar. 7, 2013

(51) Int. Cl.
*H01L 23/52* (2006.01)
*H01L 23/48* (2006.01)
*H01L 23/532* (2006.01)

(52) U.S. Cl.
USPC .................. 257/750; 257/222; 257/E23.165

(58) Field of Classification Search
USPC .................. 257/750, 222, E23.165
See application file for complete search history.

(56) References Cited

U.S. PATENT DOCUMENTS

| 2007/0173027 A1* | 7/2007 | Rhie ........................... 438/372 |
| 2011/0006425 A1* | 1/2011 | Wada et al. ................... 257/750 |
| 2012/0080661 A1 | 4/2012 | Saito et al. |
| 2012/0080662 A1 | 4/2012 | Saito et al. |
| 2012/0080796 A1 | 4/2012 | Wada et al. |

FOREIGN PATENT DOCUMENTS

| JP | 06-350030 | 12/1994 |
| JP | 2010-062333 | 3/2010 |
| JP | 2009-164432 | 7/2012 |

OTHER PUBLICATIONS

Xu, Chuan, et al., "Graphene Nano-Ribbon (GNR) Interconnects: A Genuine Contender or a Delusive Dream?" IEEE, 2008, pp. 201-204.
Naeemi, A., et al., "Performance Bencharking for Graphene Nanoribbon, Carbon Nanotube, anc Cu Interconnects", IEEE, 2008, pp. 183-185.
Korean Office Action for Korean Application No. 10-2011-87934 mailed on Oct. 15, 2012.
Japanese Office Action for Japanese Application No. 2010-193964 mailed on Jan. 4, 2013.
Translation of Official Action of Notification of Final Rejection for Korean Intellectual Property Office Application No. 10-2011-87934 Dated Apr. 29, 2013, 6 pgs.

* cited by examiner

*Primary Examiner* — Luan C Thai
(74) *Attorney, Agent, or Firm* — Turocy & Watson, LLP

(57) ABSTRACT

According to an embodiment of the present invention, a device includes a substrate, a base body formed on or above the substrate, and a pair of wirings. The base body has a line shape in a plan view and extends along a length direction. The pair of wirings includes first and second catalyst layers formed on both side surfaces of the base body in the length direction of the base body with sandwiching the base body; and first and second graphene layers formed on both side surfaces of the base body in a manner of contacting the first and second catalyst layers, respectively, and extending along the length direction of the base body, the graphene layers includes a plurality of graphenes laminated perpendicularly with respect to both side surfaces of the base body, respectively.

21 Claims, 8 Drawing Sheets

US 8,482,126 B2

SEMICONDUCTOR DEVICE

CROSS-REFERENCE TO RELATED APPLICATION

This application is based upon and claims the benefit of priority from prior Japanese Patent Application No. 2010-193964, filed on Aug. 31, 2010, the entire contents of which are incorporated herein by reference.

FIELD

Embodiments of the present invention relate to a semiconductor device.

BACKGROUND

There is a known technique of using planar graphene as wirings.

DETAILED DESCRIPTION

According to an embodiment of the invention, a device includes a substrate, a base body formed on or above the substrate, and a pair of wirings. The base body has a line shape in a plan view and extends along a length direction. The pair of wirings formed on the base body, includes first and second catalyst layers formed on both side surfaces of the base body in the length direction of the base body with sandwiching the base body, and first and second graphene layers formed on both side surfaces of the base body in a manner of contacting the first and second catalyst layers, respectively and extending along the length direction of the base body, the graphene layers includes a plurality of graphemes laminated perpendicularly with respect to the both side surfaces of the base body, respectively.

There is a technique of using planar graphene as wirings. Graphene having a hexagonal lattice structure has a quantized conductance characteristic and thus is used as a low-resistance wiring material. A graphene wiring is classified into two types: a zigzag type in which hexagonal lattices are arranged such that an arrangement of carbons in an edge part of a wiring is in a zigzag form, and an armchair type in which hexagonal lattices are arranged such that an arrangement of carbons in an edge part of a wiring is in an armchair form.

However, when the width of the wiring is narrow, the number of hexagonal lattices in the width direction of the wiring is small. Accordingly, in the wiring in which the edge structure is the armchair type, influence of an edge effect in a graphene end section increases. For this reason, modulation of a band structure of graphene or diffusion of carriers in the graphene end section becomes severe, and wiring resistance may increase. Particularly, in a fine wiring having the width equal to or less than 40 nm and having the armchair type edge structure, the wiring resistance increases due to reduction in the number of hexagonal lattices in the width direction.

Practically, it is difficult to control the edge structure of the graphene wiring to be in only the zigzag shape, and the zigzag type and the armchair type are mixed in use. Thus, there has been a problem in that the resistance of a wiring increases when the width of the graphene wiring decreases. In order to avoid this problem, the wiring is required to have the width sufficient not to increase the wiring resistance. However, this impedes miniaturization of the wiring structure.

First Embodiment

Figure 1:
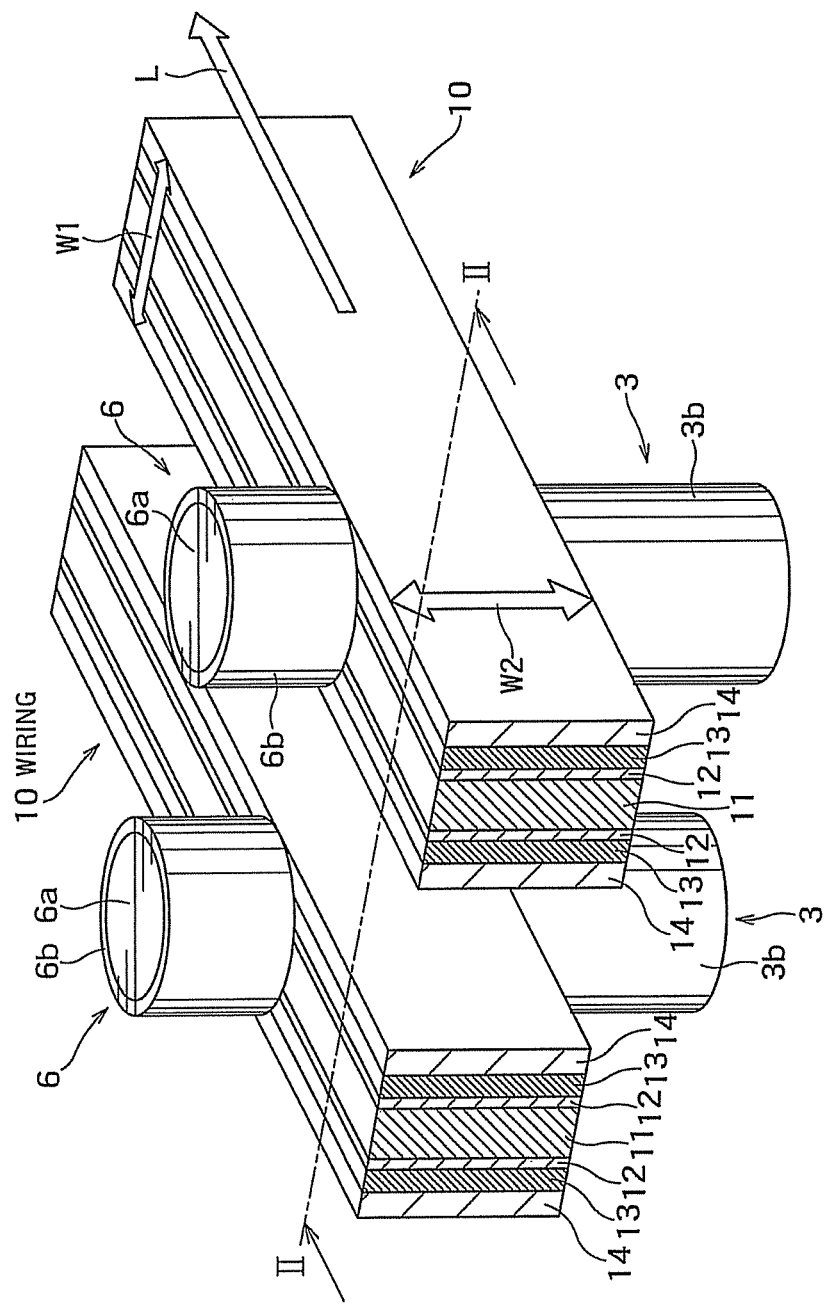
FIG. 1 is a perspective view of a semiconductor device according to a first embodiment of the present invention.
Figure 2:
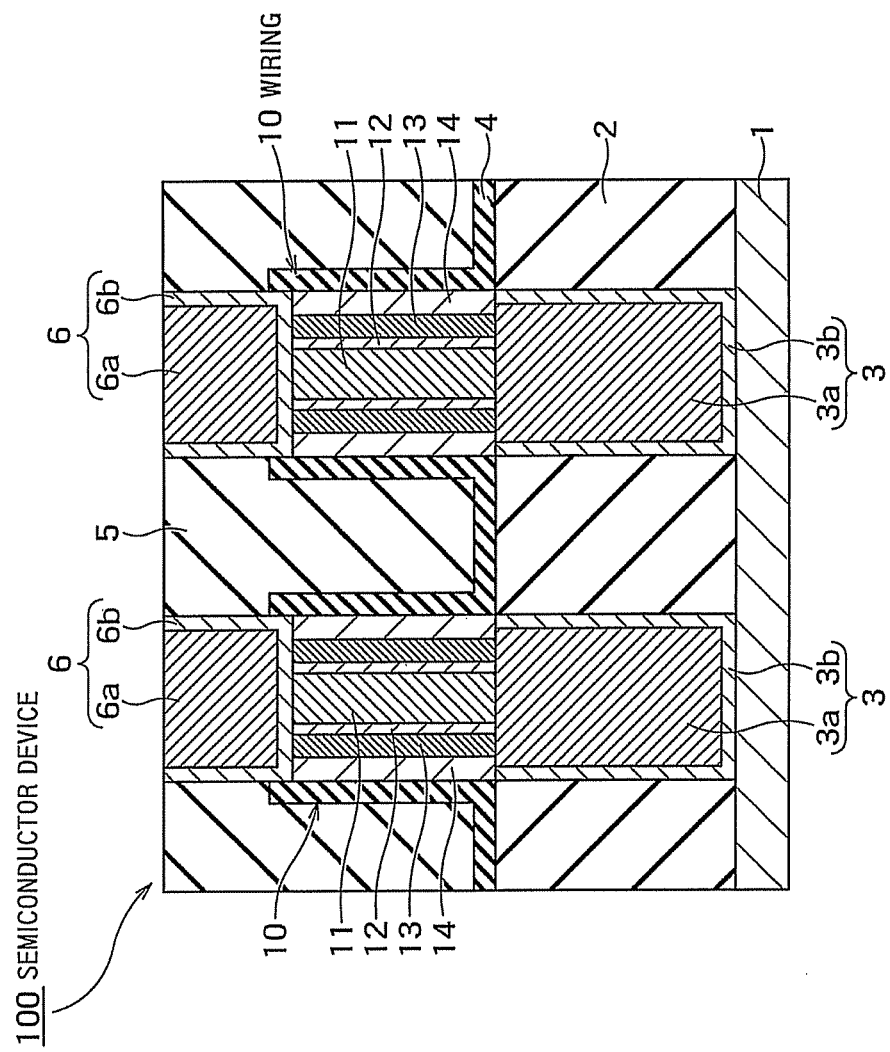
FIG. 2 is a vertical cross-sectional view of the semiconductor device taken along line segment II-II.

FIG. 1 is a perspective view of a semiconductor device 100 according to a first embodiment. FIG. 2 is a vertical cross-sectional view of the semiconductor device 100 taken along line segment II-II. Although wirings of a semiconductor are described below by way of example, the invention is not limited to wirings of a semiconductor. The invention can also be applied to other wirings for other devices.

As shown in FIGS. 1 and 2, the semiconductor device 100 includes wiring 10, a passivation film 4 that covers the top surface and the side surface of the wiring 10, which extends along a length direction and having a line shape in a plan view, contact plugs 3 and 6 that are connected to the bottom surface and the top surface of the wiring 10, respectively, and a conductive member 1 that is connected to the wiring 10 via the contact plug 3. The contact plug 3 is formed in an insulating layer 2. The wiring 10, the passivation film 4, and the contact plug 6 are formed in an insulating layer 5. The conductive member 1, the insulating layers 2 and 5, and the passivation film 4 are not illustrated in FIG. 1.

The wiring 10 includes a core member 11, a base layer 12 formed on both side surfaces of the core member 11 in the length direction L, a catalyst layer 13 formed on both side surfaces of the core member 11 via the base layer 12, and a graphene layer 14 formed on both side surfaces of the core member 11 via the base layer 12 and the catalyst layer 13. The base layers 12 are formed on both side surfaces of the core member 11 with sandwiching the core member 11. The catalyst layers 13 are formed on both side surfaces of the core member 11 with sandwiching the core member 11 via the base layer 12. The graphene layers 14 are formed on both side surfaces of the core member 11 via the base layer 12 and the catalyst layer 13.

An electric current in the wiring 10 basically flows through the graphene layer 14 in the length direction L of the wiring 10.

The core member 11 is made of, for example, metal such as Ti, Ta, Ru, or W. Since an electric current in the wiring 10 basically flows through the graphene layer 14, the core member 11 may not have conductivity. However, the core member 11 with conductivity makes it easier to connect the wiring 10 to the contact plugs 3 and 6.

Further, as a material of the core member 11, a material having excellent processability, such as polycrystalline silicon (Si), may be used. By using a material having excellent processability, it is possible to increase a ratio of the height to the width of the core member, which also increases a ratio of a width W2 of the graphene layer 14 with respect to a width W1 of the wiring 10.

The base layer 12 has a function as a promoter in growing graphene that constitutes the graphene layer 14.

The base layer 12 is made of, for example, a nitride or an oxide of metal such as Ti, Ta, Ru, or W. When the core member 11 is made of metal, the base layer 12 can be obtained by nitriding or oxidizing the surface of the core member 11. Further, the base layer 12 may have a laminate structure composed of a plurality of different layers.

When the core member 11 is made of a metallic material, the graphene layer 14 may be formed without disposing the base layer 12. However, in order to effectively grow graphene that constitutes the graphene layer 14, it is preferable to form the base layer 12, for example, using a nitride being more highly catalytic than pure metal. Further, when the core member 11 is made of a highly catalytic material such as a metal nitride, the base layer 12 may not be disposed.

The catalyst layer 13 is made of a catalyst material that functions as a catalyst in growing graphene that constitutes the graphene layer 14. As the catalyst material, a simple substance metal such as Co, Ni, Fe, Ru, or Cu, or an alloy or carbide that contains the simple substance metals may be used. The catalyst layer 13 is preferably a seamless continuous film to achieve uniform graphene. It preferably has the thickness equal to or more than 0.5 nm as the continuous film.

The graphene layer 14 is composed of one to several tens of graphenes that grow due to catalytic action of the catalyst layer 13 and has a quantized conductance characteristic. Herein, the term "graphene" is a single-layer film of graphite and has a structure in which carbons are arranged in the form of a hexagonal lattice. Since the graphene layer 14 is continuously formed in the length direction L of the wiring 10, a migration path of electrons is formed along the length direction L of the wiring 10.

It has been known that a mean free path of electrons in graphene is about 100 nm to 1 μm, and much longer than a mean free path (about 40 nm) of electrons in copper (Cu) that is a low resistance metallic material currently used in many LSI devices. For this reason, graphene is a low resistance material and thus can be used for a conductive layer of the wiring 10.

As illustrated in FIG. 1, since a direction of the width W2 of the graphene layer 14 is the same as the height direction of the wiring 10, it is desirable to increase the height of the wiring 10 in order to increase the width W2 of the graphene layer 14. For this reason, by increasing the width W2 of the graphene layer 14 instead of increasing the width W1 of the wiring 10, it is possible to suppress an increase in wiring resistance, which is generally caused when the number of hexagonal lattices in the direction of the width W2 is reduced.

That is, it is possible to obtain a fine low-resistance wiring structure by forming the wiring 10 in which the width W2 is larger than the width W1. For example, it is possible to form the wiring 10 with a width W1 of 10 nm, having the graphene layer 14 with a width W2 of 100 nm.

The conductive member 1 is, for example, a semiconductor substrate in which a semiconductor element such as a transistor or a capacitor is formed, or a conductive member such as a wiring.

The insulating layers 2 and 5 are insulating layers such as a Tetraethoxysilane (TEOS) film.

The contact plug 3 includes a central section 3a and a surface layer 3b that covers the bottom surface and the side surface thereof. The contact plug 6 includes a central section 6a and a surface layer 6b that covers the bottom surface and the side surface thereof. Formation of only one of the contact plugs 3 and 6 may be sufficient.

The central sections 3a and 6a are, for example, made of metal such as W, Cu, or Al. The surface layers 3b and 6b are made of a material that is advantageous in forming a contact that comes in contact with graphenes with a small contact resistance. Specifically, the surface layers 3b and 6b may be made of Pd, Au, Ag, Ta, Cr, Fe, Mo, or W that has a work function close to graphene, or Ti or Ni that is easy to react with carbon. More preferably, a material of the surface layers 3b and 6b is Pd. Pd features in that it has a work function close to graphene as described above and has high carbon solubility. Particularly, when Ti is used as a material of the surface layers 3b and 6b, the surface layers 3b and 6b react with the graphene layer 14, forming a TiC film on an interface. As a result, the contact resistance can be further reduced. The surface layers 3b and 6b may not be formed, but it is preferable to form the surface layers 3b and 6b in terms of a decrease in contact resistance between the contact plugs 3 and 6 and the wiring 10.

Further, the contact plugs 3 and 6 are preferably connected directly to the graphene layer 14. Particularly, when the surface layers 3b and 6b are formed, as illustrated in FIG. 2, the surface layers 3b and 6b are preferably connected directly to the graphene layer 14. More preferably, the surface layers 3b and 6b are connected directly to the graphene layer 14 with as large contact area as possible.

Further, since the contact plugs 3 and 6 are connected directly to an end section other than the surface of the graphene layer 14, the contact plugs 3 and 6 may be connected directly to at least two of a plurality of laminated graphenes that constitute the graphene layer 14.

The passivation film 4 has a function of preventing metallic atoms contained in the wiring 10 from being diffused and a function as an etching stopper when forming a contact hole for the contact plug 6 in the insulating layer 5. The passivation film 4 is made of an insulating material such as SiN.

Further, there may be provided a metallic film having a thickness of about 2 nm that covers the surface of the graphene layer 14 (that is, the side surface of the wiring 10). With the metallic film formed, even when an area in which graphene is discontinuous is included in the graphene layer 14, electrical conduction can be compensated. As a material of the metallic film, a material having a work function close to graphene, such as Au, Pd, Ag, Ta, Cr, Fe, Mo, or W, is preferably used. Even if the metallic materials are formed on graphene, the metallic materials do not change a Dirac point of the graphene layer and do not reduce the migration speed of carriers conducted through graphene.

An example of a method of manufacturing the semiconductor device 100 according to the present embodiment will be described below.

FIGS. 3A to 3H are vertical cross-sectional views illustrating processes of manufacturing the semiconductor device 100 according to the first embodiment.

Figure 3A:
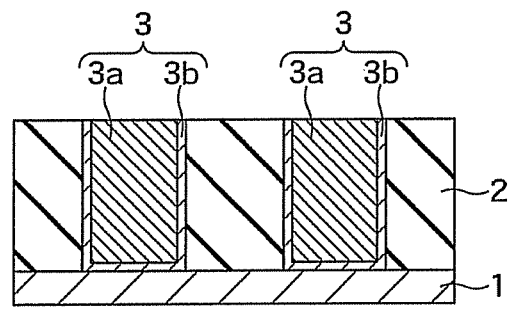
FIGS. 3A to 3H are vertical cross-sectional views illustrating processes of manufacturing the semiconductor device according to the first embodiment.

First, as illustrated in FIG. 3A, a contact layer insulating layer 2 including the contact plug 3 is formed on a conductive member 1.

Figure 3B:
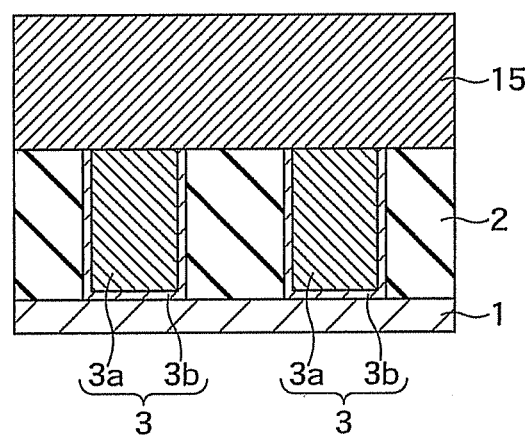

Next, as illustrated in FIG. 3B, a metallic film 15 is formed on the installing layer 2. Alternatively, a film made of a different material may be formed, in place of the metallic film 15, in view of a material of a core member 11.

Figure 3C:
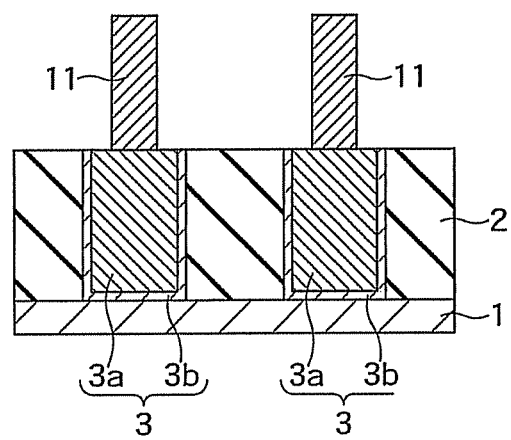

Next, as illustrated in FIG. 3C, the metallic film 15 is patterned by photolithography and reactive ion etching (RIE), and processed into the core member 11.

Figure 3D:
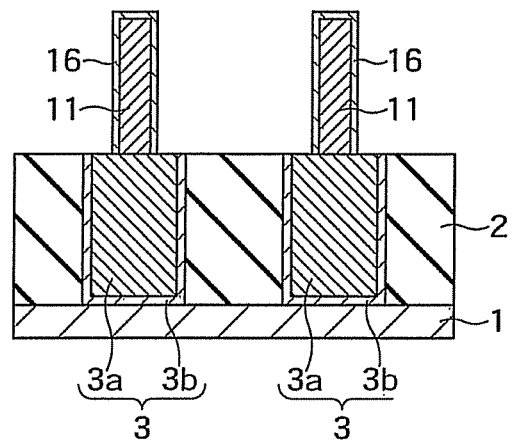

Next, as illustrated in FIG. 3D, a nitriding process is performed on the surface of the core member 11 to form a nitride film 16. Alternatively, a film made of a different material may be formed, in place of the nitride film 16, in view of a material of the base layer 12. Further, when the core member 11 made of a metallic nitride is formed using a metal nitride film in place of the metallic film 15, the nitride film 16 may not be formed.

Figure 3E:
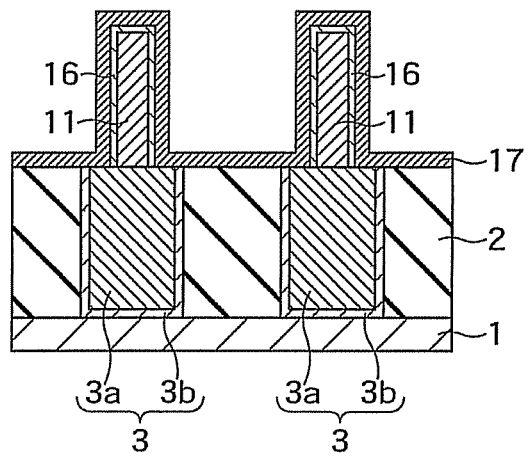

Next, as illustrated in FIG. 3E, a catalyst layer 17 is formed to cover the surface of the nitride film 16 by a chemical vapor deposition (CVD) technique.

Figure 3F:
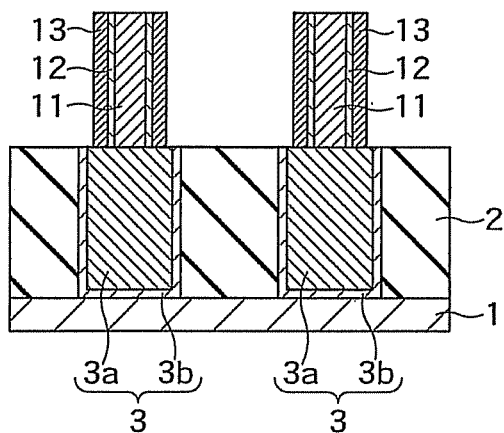

Next, as illustrated in FIG. 3F, the whole area of the catalyst film 17 and the nitride film 16 are etched by anisotropic etching to remove parts of the top surface of the insulating layer 2 and the top surface of the core member 11. As a result, the catalyst film 17 and the nitride film 16 are processed into the catalyst layer 13 and the base layer 12, respectively. Further, parts of the catalyst film 17 and the nitride film 16 on the top surface of the core member 11 may not be removed.

Figure 3G:
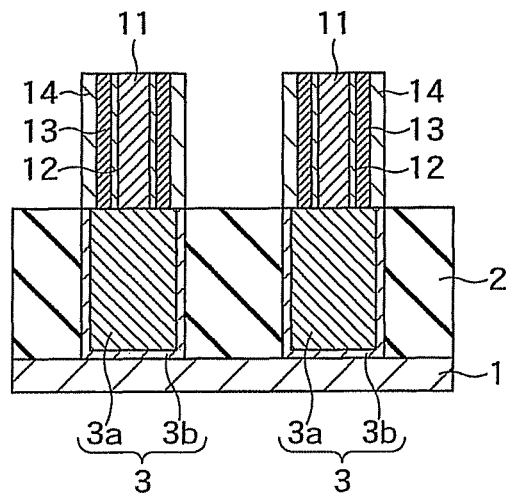

Next, as illustrated in FIG. 3G, graphene is grown on the side surface of the catalyst layer 13 by a CVD technique to form the graphene layer 14. As a carbon source of graphene, hydrocarbon-based gas such as methane and acetylene or mixed gas thereof may be used. Further, as carrier gas, hydrogen gas or rare gas may be used.

An example of the details of a method of forming the graphene layer 14 is described below. First, in order to prevent microparticulation of the catalyst layer 13 due to agglomeration, a plasma process is performed. By preventing microparticulation of the catalyst layer 13 and maintaining continuity of the surface of the catalyst layer 13, the uniform growth of graphene can be promoted. Hydrogen gas or rare gas is preferably used as discharge gas used in the plasma process, but mixed gas of hydrogen gas and rare gas may be used. The lower the process temperature is, the higher the effect is. It is preferable to perform the plasma process at the room temperature. Further, relatively strong plasma is preferable, and exposure to high-power remote plasma or ordinary plasma further increases the effect.

When the forming temperature of the graphene layer 14 is low, for example, when the forming temperature of the graphene layer 14 is equal to or less than 600° C., it is preferable that the surface of the catalyst layer 13 has roughness, and it is possible to activate graphene formation by the roughness even at the low temperature. Thus, it is preferable to give the roughness to the surface of the catalyst layer 13 before forming the graphene layer 14.

Next, the catalyst layer 13 is carbonized. As discharge gas, hydrocarbon-based gas, such as methane and acetylene or mixed gas thereof, may be used. As carrier gas, hydrogen gas or rare gas may be used. The process needs to be performed at a temperature which is lower than a process temperature at the time of graphene formation, which will be described later, and at which the graphite film can be formed. Preferably, the temperature is about 150° C. to 600° C. Further, a process time may be short. The process is also preferably performed using relatively strong plasma.

Next, a plasma process for qualitative improvement and catalyst activation of the carbonized layer of the catalyst layer 13 is performed. Rare gas is preferably used as a discharge gas. Preferably, a process temperature is intermediate between the process temperature at the time of carbonization of the catalyst layer 13 and a process temperature at the time of graphene formation which will be described later. In this process, relatively weak plasma may be used, and it is preferable to use remote plasma.

Finally, graphene is performed. As a discharge gas, a hydrocarbon-based gas or a mixed gas thereof may be used. A process temperature is about 200° C. to 1000° C. Particularly, the process temperature is preferably about 350° C. If the process temperature is less than 200° C., the sufficient growth speed cannot be obtained, and the graphene hardly grows. At a temperature equal to or more than 200° C., the graphene growth occurs, and the uniform graphene film is formed. The process temperature is equal to or less than the process temperature used in a wiring forming process of a typical LSI device, and the graphene forming process is excellent in affinity with a semiconductor process.

In the present process, it is important to remove electrons and supply only radical onto the catalyst layer 13, and thus it is preferable to remotely control and use very weak plasma. Further, in order to remove ions and electrons, an effective technique is to install an electrode at the top of the substrate and apply a voltage. Preferably, an applied voltage is about 0 V to ±100 V.

The graphene layer 14 can be obtained by the above-described multi-step process. The graphene layer 14 can be formed by the process of the CVD technique using the hydrocarbon-based gas under a single condition. However, by using the above-described multi-step process, the low-resistance graphene layer 14 that is more excellent in uniformity can be formed under the low temperature condition. By lowering the graphene forming temperature, it is possible to suppress negative influence, which results from the high temperature process, on the members of the semiconductor device 100. Further, uniformly grown graphene facilitates electrical conduction in the graphene layer 14 and reduces resistance of the wiring 10.

When the metallic film that covers the surface of the graphene layer 14 is formed, the process of processing the catalyst film 17 and the nitride film 16 illustrated in FIG. 3F may not be performed. In this case, the graphene layer 14 and the metallic film are formed on the catalyst film 17, and thereafter, the metallic film, the graphene layer 14, the catalyst film 17, and the nitride film 16 are processed.

Figure 3H:
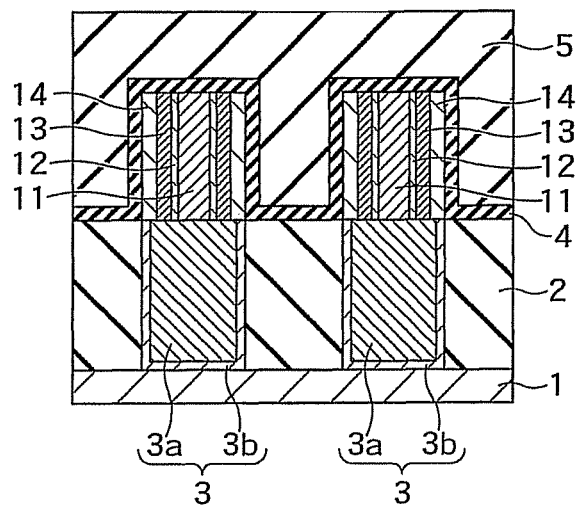

Next, as illustrated in FIG. 3H, the passivation film 4 and the insulating layer 5 are formed. The passivation film 4 is formed by a CVD technique to cover the surfaces of the wiring 10 and the insulating layer 2. The insulating layer 5 is formed on the passivation film 4 by a CVD technique.

Next, the contact plug 6 is formed in the insulating layer 5, thereby producing the semiconductor device 100 illustrated in FIG. 2. The contact plug 6 is formed by filling material films of the central section 6a and the surface layer 6b in the contact hole formed in the insulating layer 5 by photolithography and RIE. Further, when the contact hole is formed, the passivation film 4 may be used as an etching stopper.

Second Embodiment

A second embodiment of the present invention is different from the first embodiment in that the graphene layer is formed on the side surface and the top surface of the wiring. Thus, in the second embodiment, contact resistance between the graphene layer and the contact plug can be reduced. Further, since the graphene layer is connected even to the top surface of the wiring, it is possible to increase the width of the graphene layer without increasing the height of the core member Accordingly, the number of hexagonal lattices arranged in the width direction of the graphene layer can be increased, and thereby preventing wiring resistance from increasing due to an edge effect. Here, a description of the same points as in the first embodiment is simplified or not repeated.

Figure 4:
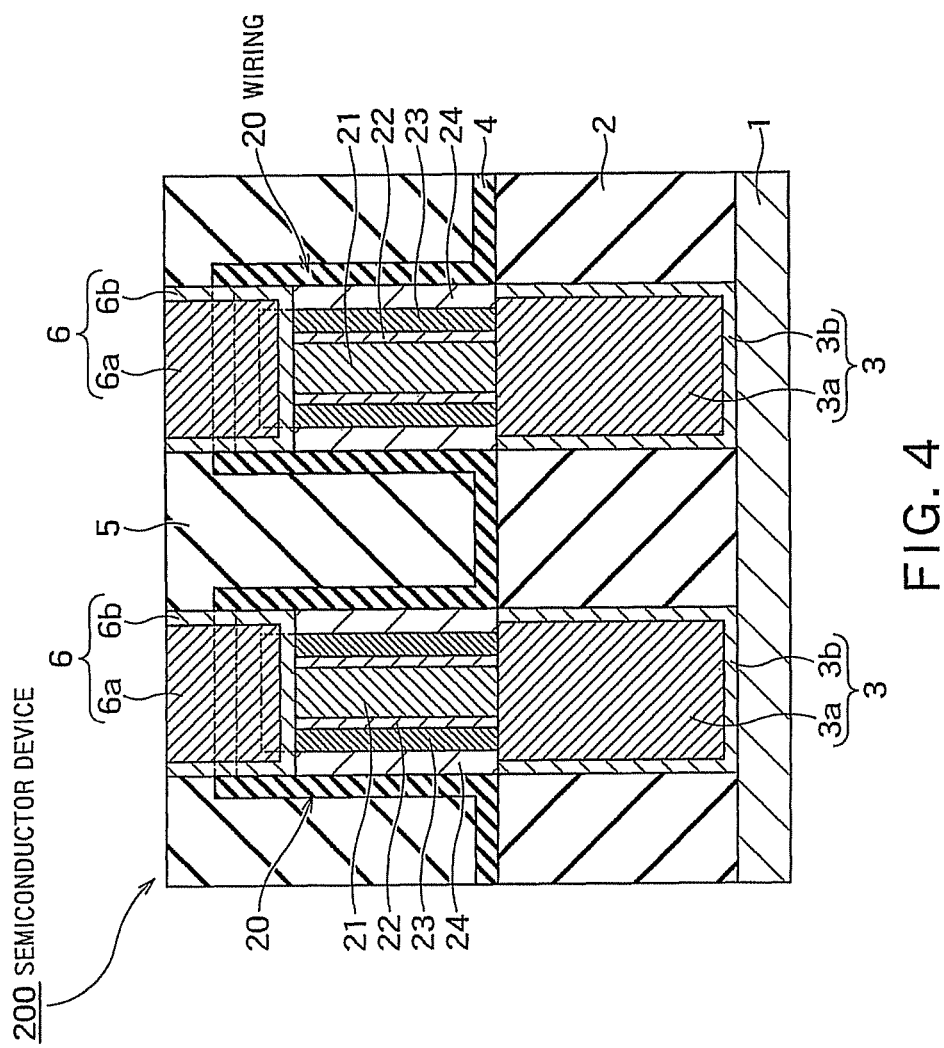
FIG. 4 is a vertical cross-sectional view of a semiconductor device according to a second embodiment of the present invention.

FIG. 4 is a vertical cross-sectional view of a semiconductor device 200 according to the second embodiment.

The semiconductor device 200 includes a wiring 20, a passivation film 4 that covers the top surface and the side surface of the wiring 20, contact plugs 3 and 6 that are connected to the bottom surface and the top surface of the wiring 20, respectively, and a conductive member 1 that is connected to the wiring 20 via the contact plug 3. The contact plug 3 is formed in an insulating layer 2. The wiring 20, the passivation film 4, and the contact plug 6 are formed in an insulating layer 5.

The wiring 20 includes a core member 21, a base layer 22 formed on both side surfaces and the top surface of the core member 11, a catalyst layer 23 formed on the both side surfaces and the top surface of the core member 21 via the base layer 22, and a graphene layer 24 formed on the both side surfaces and the top surface of the core member 21 via the base layer 22 and the catalyst layer 23.

The core member 21, the base layer 22, the catalyst layer 23, and the graphene layer 24 are made of the same material as the core member 11, the base layer 12, the catalyst layer 13, and the graphene layer 14 of the first embodiment, respectively.

The contact plug 6 is preferably formed to pass through the graphene layer 24 on the wiring 20 in order to increase an area of contact with the graphene layer 24 and reduce contact resistance. Dotted lines above the contact plug 6 of FIG. 4 represent the positions of the base layer 22, the catalyst layer 23, and the graphene layer 24 in a cross section in which the contact plug 6 is not present.

An example of a method of manufacturing the semiconductor device 200 according to the present embodiment will be described below.

Figure 5A:
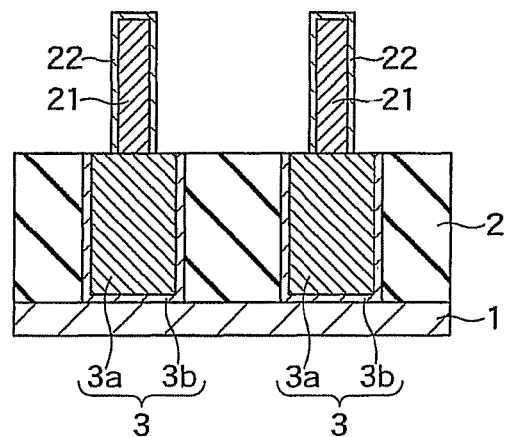
FIGS. 5A to 5C are vertical cross-sectional views illustrating processes of manufacturing the semiconductor device according to the second embodiment.
Figure 5B:
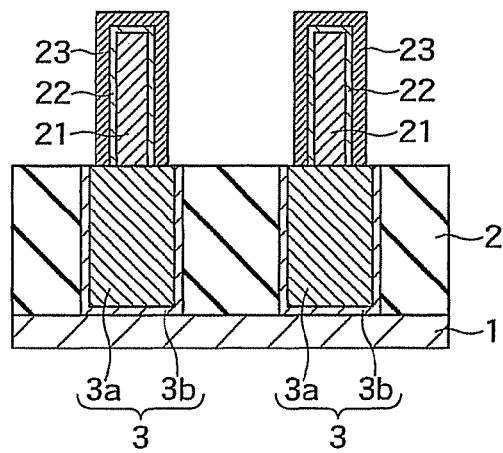
Figure 5C:
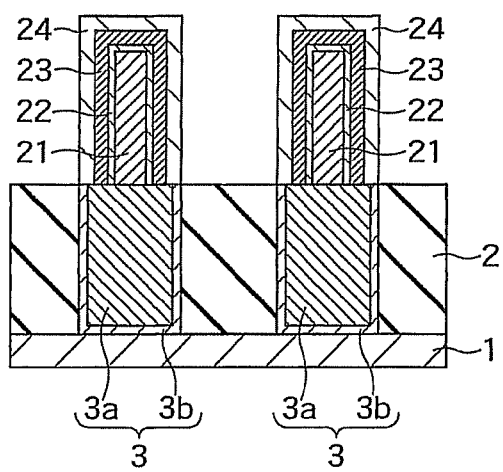

FIGS. 5A to 5C are vertical cross-sectional views illustrating a process of manufacturing the semiconductor device 200 according to the second embodiment.

First, as illustrated in FIG. 5A, the process of forming the nitride film 16 illustrated in FIG. 3D is performed in the same manner as in the first embodiment. In the present embodiment, since the nitride film (or any other film corresponding to the nitride film) is not processed, the base layer 22 formed of, for example, the nitride film is obtained in this step.

Next, as illustrated in FIG. 5B, the catalyst layer 23 is selectively formed on the surface of the base layer 22 by a selective CVD technique.

Next, as illustrated in FIG. 5C, graphene is grown on the surface of the catalyst layer 23 by a CVD technique to form the graphene layer 24.

The processes subsequent to the process of forming the passivation film are performed in the same manner as in the first embodiment. However, the contact plug 6 is preferably formed to pass through the graphene layer 24 on the wiring 20.

Third Embodiment

A third embodiment of the present invention is different from the first embodiment in that two graphene layers in a wiring function as two independent wirings. Thus, in the third embodiment, a plurality of wirings are easily arranged via a narrow gap. Here, a description of the same points as in the first embodiment is simplified or not repeated.

Figure 6:
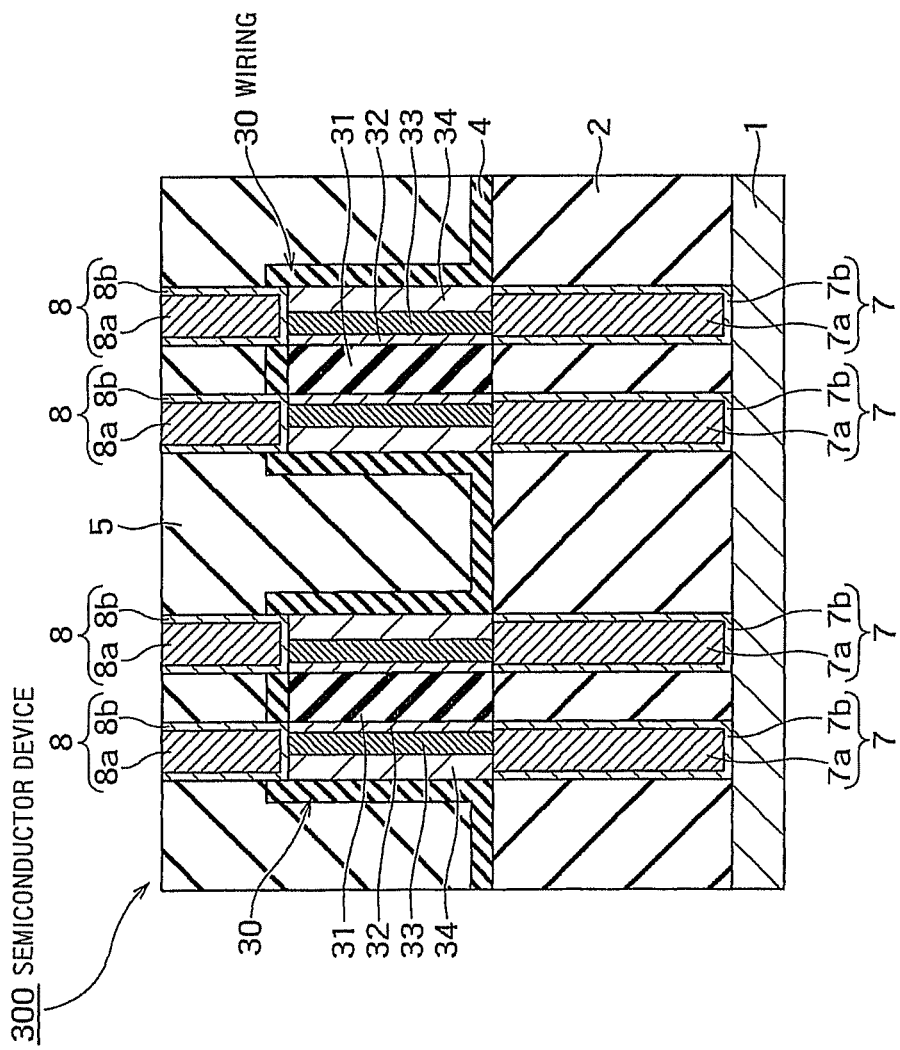
FIG. 6 is a vertical cross-sectional view of a semiconductor device according to a third embodiment.

FIG. 6 is a vertical cross-sectional view of a semiconductor device 300 according to the third embodiment.

The semiconductor device 300 includes a wiring 30, a passivation film 4 that covers the top surface and the side surface of the wiring 30, contact plugs 7 and 8 that are connected to the bottom surface and the top surface of the wiring 30, respectively, and a conductive member 1 that is connected to the wiring 30 via the contact plug 7. The contact plug 7 is formed in an insulating layer 2. The wiring 30, the passivation film 4, and the contact plug 8 are formed in an insulating layer 5.

The wiring 30 includes a core member 31, a base layer 32 formed on both side surfaces of a length direction L of the core member 31, a catalyst layer 33 formed on the both side surfaces of the core member 31 via the base layer 32, and a graphene layer 34 formed on the both side surfaces of the core member 31 via the base layer 32 and the catalyst layer 33.

The core member 31 is made of an insulating material such as SiN. Particularly, by using $SiO_2$ having excellent processability as a material of the core member, it is possible to increase a ratio of the height to the width of the core member 31, and to increase a ratio of the width of the graphene layer 34 with respect to the width of the wiring 30.

Since the core member 31 is an insulator, the graphene layers 34 on the both side surfaces of the core member 31 are insulated from each other in the wiring 30. Since the contact plugs 7 and 8 are formed on the graphene layers 34 on the both side surfaces of the core member 31, the graphene layers 34 on the both side surfaces of the core member 31 function as two independent wirings. Since two independent wirings are formed from one core member, it is effective in miniaturization.

Similarly to the core member 11 of the first embodiment, the core member 31 may be formed by patterning a material film (an insulating film) by photolithography and RIE. Further, the width of the core member 31 may be narrowed by performing a sliming process on a resist mask in the photolithography process.

The base layer 32, the catalyst layer 33, the graphene layer 34, central sections 7a and 8a, and surface layers 7b and 8b are made of the same material as the base layer 12, the catalyst layer 13, the graphene layer 14, the central sections 3a and 6a, and the surface layers 3b and 6b of the first embodiment, respectively.

It has been described above that the two graphene layers 34 are formed on the both side surfaces of the core member 31 as two independent wirings, but in the third embodiment, one graphene layer 34 may be formed on one side surface of the core member 31 as one wiring.

According to the first to third embodiments, provided are the base body having the catalyst layers on both side surfaces of the wiring in the length direction of the wiring, and the graphene layers formed on both side surfaces of the base body while contacting the catalyst layers. Thus, it is possible to increase the width of the graphene layer and thus to increase the number of hexagonal lattices in the width direction of the graphene layer without increasing the width of the wiring. This suppresses an increase in wiring resistance attributable to an edge effect. In other words, a miniature wiring structure with low resistance can be obtained.

For example, in the first to third embodiments, the core member, the base layer, and the catalyst layer correspond to the above-described base body. When the base layer is not formed, the core member and the catalyst layer correspond to the base body. Further, in the first and second embodiments, when the core member is made of a catalyst material that functions as a catalyst for graphene growth, the base layer and the catalyst layer may not be formed. In this case, since the surface of the core member functions as the catalyst layer, the core member corresponds to the base body.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A device, comprising:
a substrate;
a base body formed on or above the substrate, the base body having a line shape in a plan view and extending along a length direction; and
a pair of wirings formed on the base body including
first and second catalyst layers formed on both side surfaces of the base body in the length direction of the base body with sandwiching the base body, and
first and second graphene layers formed on the both side surfaces of the base body in a manner of contacting the first and second catalyst layers, respectively and extending along the length direction of the base body, the graphene layers including a plurality of graphemes laminated perpendicularly with respect to the both side surfaces of the base body, respectively,
wherein a central section of the base body is an insulator, the first and second graphene layers are electrically insulated from each other by the insulator, and the pair of wirings are insulated from each other.

2. The device according to claim 1,
wherein a width of the first graphene layer and a width of the second graphene layer are larger than a width of a top surface of the base body.

3. The device according to claim 1,
wherein the width of the first and second graphene layers on the both side surfaces of the base body is equal to or more than 30 nm.

4. The device according to claim 1,
wherein the first and second catalyst layers contain metal, an alloy, or a carbide that contains at least one of Co, Ni, Fe, Ru, and Cu.

5. The device according to claim 1, further comprising a contact plug,
wherein the contact plug is connected to an end of the first graphene layer or to an end of the second grapheme layer.

6. The device according to claim 1, further comprising a plurality of contact plugs,
wherein a first contact plug is connected to an end of the first graphene layer and a second contact plug is connected to an end of the second graphene layer.

7. The device according to claim 5,
wherein the contact plug includes a central section and a surface layer, and the surface layer is connected to an end of the first graphene layer or to an end of the second graphene layer.

8. The device according to claim 7,
wherein the surface layer includes a metal containing any one of Pd, Ti, and Ni.

9. The device according to claim 1, further comprising base layers between the base body and the first catalyst layer and between the base body and the second catalyst layer.

10. A device, comprising:
a substrate;
a base body formed on or above the substrate, the base body having a line shape in a plan view and extending along a length direction;
a pair of wirings formed on the base body including
first and second catalyst layers formed on both side surfaces of the base body in the length direction of the base body with sandwiching the base body, and
first and second graphene layers formed on the both side surfaces of the base body in a manner of contacting the first and second catalyst layers, respectively and extending along the length direction of the base body, the graphene layers including a plurality of graphenes laminated perpendicularly with respect to the both side surfaces of the base body, respectively; and
a contact plug,
wherein the first and second graphene layers are separated from each other by the base body, and the pair of wirings are electrically connected to each other by the contact plug.

11. The device according to claim 10,
wherein a width of the first graphene layer and a width of the second graphene layer are larger than a width of a top surface of the base body.

12. The device according to claim 10,
wherein a width of the first graphene layer and a width of the second graphene layer are equal to or more than 30 nm.

13. The device according to claim 10,
wherein the contact plug is connected to ends of the first and second graphene layers.

14. The device according to claim 13,
wherein the contact plug is connected directly to ends of at least two graphenes of the plurality of graphenes included in each of the first and second graphene layers.

15. A device, comprising:
a substrate;
a base body formed on or above the substrate, the base body having a line shape in a plan view and extending along a length direction;
a pair of wirings formed on the base body including
first and second catalyst layers formed on both side surfaces of the base body in the length direction of the base body with sandwiching the base body, and
first and second graphene layers formed on the both side surfaces of the base body in a manner of contacting the first and second catalyst layers, respectively and extending along the length direction of the base body, the graphene layers including a plurality of graphemes laminated perpendicularly with respect to the both side surfaces of the base body, respectively;
a third catalyst layer formed to cover a top surface of the base body; and
a third graphene layer formed on the top surface of the base body in a manner of contacting the third catalyst layer and extending along the length direction of the base body, the third graphene layer including a plurality of graphenes laminated perpendicularly with respect to the top surface of the base body,
wherein the first graphene layer and the second grapheme layer are connected by the third graphene layer.

16. The device according to claim 15,
wherein the third catalyst layer contains a metal, an alloy, or a carbide that contains at least one of Co, Ni, Fe, Ru, and Cu.

17. The device according to claim 15, further comprising a contact plug,
wherein the contact plug is connected to ends of the first and second graphene layers.

18. The device according to claim 17,
wherein the contact plug is connected directly to ends of at least two graphenes of the plurality of graphenes included in the first graphene layer and ends of at least two graphenes of the plurality of graphenes included in the second graphene layer.

19. The device according to claim 17,
wherein the contact plug passes through the third graphene layer.

20. The device according to claim 10,
wherein the base body is sandwiched between the first graphene layer and the second graphene layer via the first and second catalyst layers.

21. The device according to claim 1,
wherein the base body is sandwiched between the first graphene layer and the second graphene layer via the first and second catalyst layers.

* * * * *